US012719418B2

(12) United States Patent
Przyborowski

(10) Patent No.: US 12,719,418 B2
(45) Date of Patent: Aug. 25, 2026

(54) SIGNAL PROCESSING

(71) Applicant: Nordic Semiconductor ASA, Trondheim (NO)

(72) Inventor: Dominik Przyborowski, Trondheim (NO)

(73) Assignee: Nordic Semiconductor ASA, Trondheim (NO)

( * ) Notice: Subject to any disclaimer, the term of this patent is extended or adjusted under 35 U.S.C. 154(b) by 464 days.

(21) Appl. No.: 18/289,735

(22) PCT Filed: May 6, 2022

(86) PCT No.: PCT/EP2022/062349
§ 371 (c)(1),
(2) Date: Nov. 6, 2023

(87) PCT Pub. No.: WO2022/234122
PCT Pub. Date: Nov. 10, 2022

(65) Prior Publication Data

US 2024/0283412 A1 Aug. 22, 2024

(30) Foreign Application Priority Data

May 7, 2021 (GB) ...................................... 2106540

(51) Int. Cl.
*H03F 3/45* (2006.01)
*H03F 1/30* (2006.01)
(Continued)

(52) U.S. Cl.
CPC ............. *H03F 3/082* (2013.01); *H03F 1/301* (2013.01); *H03F 3/45179* (2013.01); *H03G 3/3084* (2013.01); *H03F 2200/447* (2013.01)

(58) Field of Classification Search
CPC ................. H03F 3/45; H03F 1/22; H03F 3/08
(Continued)

(56) References Cited

U.S. PATENT DOCUMENTS 5,451,902 A * 9/1995 Huang ................. H03G 3/3084 330/253
2011/0273231 A1 11/2011 Nakamura

FOREIGN PATENT DOCUMENTS

JP 2008-182619 A 8/2008
WO WO 2020/176132 A1 9/2020

OTHER PUBLICATIONS

International Search Report and Written Opinion for PCT/EP2022/062349, mailed Sep. 6, 2022, 19 pages.

(Continued)

*Primary Examiner* — Henry Choe
(74) *Attorney, Agent, or Firm* — Klarquist Sparkman, LLP

(57) ABSTRACT

A signal processing device is configured to compensate for process and temperature variations deviating from a nominal process and temperature condition. A transconductance amplifier circuit produces a current output dependent on a voltage input and a transconductance gain. A transimpedance amplifier circuit produces a voltage output dependent on the current. A bias circuit comprises transistors ($M_1$, $M_2$) configured such that the gate and drain of the first transistor ($M_1$) are connected to the gate of the second transistor ($M_2$) and to a PTAT current source. The source of the first transistor ($M_1$) is connected to a node via a first resistor ($R_1$), and the source of the second transistor ($M_2$) is connected to that node via a second, trimmable resistor ($R_2$). A feedback circuit for the transimpedance amplifier comprises a third, trimmable resistor ($R_3$). The ratio between a resistance of the second and third resistors ($R_2$, $R_3$) is constant.

20 Claims, 4 Drawing Sheets

(51) Int. Cl.
*H03F 3/08* (2006.01)
*H03G 3/30* (2006.01)

(58) Field of Classification Search
USPC ........................................ 330/257, 310, 260
See application file for complete search history.

(56) References Cited

OTHER PUBLICATIONS

ISO Combined Search and Examination Report under Sections 17 and 18(3) for GB2106540.4, dated Oct. 25, 2021, 6 pages.
Mak et al., "Experimental 1-V flexible-IF CMOS analogue-baseband chain for IEEE 802.11a/b/g WLAN receivers," *IET Circuits Devices System*, vol. 1, No. 6, 2007.
Yamaji et al., "A Temperature-Stable CMOS Variable-Gain Amplifier with 80-dB Linearly Controlled Gain Range," *IEEE Journal of Solid-State Circuits*, vol. 37, No. 5, May 1, 2002.

* cited by examiner

SIGNAL PROCESSING

CROSS REFERENCE TO RELATED APPLICATIONS

This is the U.S. National Stage of International Application No. PCT/EP2022/062349, filed May 6, 2022, which was published in English under PCT Article 21(2), which in turn claims the benefit of Great Britain Application No. 2106540.4, filed May 7, 2021.

TECHNICAL FIELD

The present invention relates to signal processing devices, particularly though not exclusively in relation to signal processing devices in e.g. a radio receiver.

BACKGROUND TO THE INVENTION

Many modern electronic devices include one or more signal processing chains, for example one or more radio transmitters, receivers, and/or transceivers that are used for the transmission, reception, and/or exchange of signals over a wireless interface.

The analogue signal processing chains (e.g. in a radio receiver) typically amplify and filter an incoming signal. Some signal processing chains, known in the art per se, use a cascade of a transconductance stage and a transimpedance stage. Such a conventional device, known in the art per se, can be seen in the schematic diagram of FIG. 1. FIG. 1 shows an electronic device 100 having cascaded transconductance amplifier 102 and transimpedance amplifier 104 stages.

The electronic device 100 is configured such that the transconductance amplifier circuit portion 102 comprises a respective input configured to receive a differential input voltage $V_{in}$ across the non-inverting and inverting inputs of the transconductance amplifier 102 and produces a respective output current $I_{out}$ which depends on the input voltage $V_{in}$. Specifically, the output current $I_{out}$ is equal to the voltage difference between the non-inverting and inverting inputs (i.e. $V_{in}$) multiplied by the transconductance gain $G_m$ of the transconductance amplifier 102.

In the example of FIG. 1, the transimpedance amplifier circuit portion 104 has a single-ended input configured to receive the current $I_{out}$ from the transconductance amplifier 102, and generates an output voltage $V_{out}$, where the output voltage Vout is determined by the transimpedance gain of the transimpedance amplifier 104 multiplied by the current $I_{out}$ from the transconductance amplifier 102. It will be appreciated that the invention described herein relates both to single-ended and differential amplifiers, however a single-ended amplifier is discussed here for ease of illustration and reference.

Thus the input signal $V_{in}$ is converted to a current $I_{out}$ by the transconductance amplifier 102 with gain $G_m$, and this current is subsequently converted to an output voltage $V_{out}$ and filtered by transimpedance amplifier stage 104 provided with an RC filter based feedback circuit portion 106. The feedback circuit 106 is constructed from a trimmable resistor $R_3$ and a capacitor $C_1$ connected in parallel between the input and output of the transimpedance amplifier 104.

The total gain of the device 100 is set by the product of their respective gains $G_m$ and R, where Gm is the transconductance stage gain and R is the transimpedance stage gain. Thus the total gain $K_{tot}$ of such a cascade of amplifiers can be expressed as per Equation 1 below:

$$K_{tot} = G_m \times R_3 \quad \text{Equation 1}$$

Gain of cascaded transconductance and transimpedance amplifier stages where: $K_{tot}$ is the total gain of the cascaded amplifier stages; $G_m$ is the gain of the transconductance amplifier stage; and $R_3$ is the gain of the transimpedance amplifier.

The gain $G_m$ of the transconductance amplifier stage can be described as per Equation 2 below:

$$G_m = K_{OTA} I_{bias} \frac{q}{kT} G(I) \quad \text{Equation 2}$$

Gain $G_m$ of transconductance amplifier stage where: $K_{OTA}$ is a constant (related to ratio of the transconductance amplifier's internal transistors); $I_{bias}$ is a biasing current, which may be proportional to a reference current $I_{PTAT}$ from a proportional-to-absolute-temperature (PTAT) current source as outlined below; q is elementary charge (1.602e-19 C); k is the Boltzmann constant (1.38e-23 J/K); T is temperature (K); and G(I) is a technology-dependent function describing transistor operation point with respect to current density, which is equal to 1 for BJT and weak inverted metal-oxide-semiconductor (MOS) devices.

Generally, it is desirable to keep the bandwidth and the gain constant across process and temperature variation. One approach, known in the art per se, is to use a trimmable resistor to control the bandwidth quantity by keeping the resistor-capacitor (or 'RC') product constant over process variations, while a PTAT current reference is used to keep the transconductance of the transistors constant over temperature variations. The PTAT current is supplied to the transconductance amplifier via a bias circuit 108. The trimmable resistor, typically located in the feedback path of the transimpedance amplifier (i.e. in the feedback circuit 106), sets the gain of the transimpedance amplifier stage.

Using a PTAT current as a reference allows temperature variations to be compensated. However, process variation of passive elements (e.g. resistors and capacitors) values typically necessitates adjustment of a trimmable feedback resistor to keep signal bandwidth constant. By trimming the resistance of the feedback resistor, the signal bandwidth is kept constant, but the signal gain is then changed linearly. As a result, the total gain of the cascaded transconductance and transimpedance amplifier stages can be re-written as per Equation 3 below:

$$K_{tot} = K_{OTA} I_{300} T \frac{q}{kT} G(I) \times R_{typ}(1+\alpha) = CONST(T) \times R_{typ}(1+\alpha) \quad \text{Equation 3}$$

Varying gain of cascaded transconductance and transimpedance amplifier stages where: $I_{300}$ is the value of the PTAT current at room temperature (300 K); $R_{typ}$ is a default value of trimmable feedback resistor (i.e. for a typical process); and a is a relative range of trimming.

The Applicant has appreciated that an improved approach in which the gain is consistent over process and temperature would provide significant benefits.

SUMMARY OF THE INVENTION

When viewed from a first aspect, embodiments of the present invention provide a signal processing device configured to compensate for process and temperature variations deviating from a nominal process and temperature condition, the signal processing device comprising:

i) a transconductance amplifier circuit portion having a respective voltage input and a current output, wherein the current output is dependent on the voltage input and a transconductance gain of said transconductance amplifier circuit portion;

ii) a transimpedance amplifier circuit portion having a respective current input and a voltage output, wherein the voltage output is dependent on the current input and a transimpedance gain of said transimpedance amplifier circuit portion, wherein said transconductance and transimpedance amplifier circuit portions are arranged in series;

iii a bias circuit portion comprising first and second transistors configured such that:

a gate terminal and a drain terminal of the first transistor are connected to a gate terminal of the second transistor and to a reference current input configured to receive a reference current from a proportional-to-absolute-temperature current source;

a drain terminal of the second transistor is connected to a current supply input of the transconductance amplifier;

a source terminal of the first transistor is connected to a node via a first resistor; and a source terminal of the second transistor is connected to said node via a second resistor, wherein the second resistor is trimmable; and iv) a feedback circuit portion connected between the input and output of the transimpedance amplifier, said feedback circuit portion comprising a third resistor, wherein the third resistor is trimmable;

wherein a resistance of the first resistor is a predetermined value, said predetermined value being a resistance of the trimmable third resistor at the nominal process and temperature condition.

The invention allows a ratio between a resistance of the trimmable second resistor and the resistance of the trimmable third resistor to be kept constant when said resistances are varied. The first aspect of the present invention therefore extends to a signal processing device configured to compensate for process and temperature variations deviating from a nominal process and temperature condition, the signal processing device comprising:

i) a transconductance amplifier circuit portion having a respective voltage input and a current output, wherein the current output is dependent on the voltage input and a transconductance gain of said transconductance amplifier circuit portion;

ii) a transimpedance amplifier circuit portion having a respective current input and a voltage output, wherein the voltage output is dependent on the current input and a transimpedance gain of said transimpedance amplifier circuit portion, wherein said transconductance and transimpedance amplifier circuit portions are arranged in series;

iii) a bias circuit portion comprising first and second transistors configured such that:

a gate terminal and a drain terminal of the first transistor are connected to a gate terminal of the second transistor and to a reference current input configured to receive a reference current from a proportional-to-absolute-temperature current source;

a drain terminal of the second transistor is connected to a current supply input of the transconductance amplifier;

a source terminal of the first transistor is connected to a node via a first resistor; and a source terminal of the second transistor is connected to said node via a second resistor, wherein the second resistor is trimmable; and iv) a feedback circuit portion connected between the input and output of the transimpedance amplifier, said feedback circuit portion comprising a third resistor, wherein the third resistor is trimmable;

wherein a resistance of the first resistor is a predetermined value, said predetermined value being a resistance of the trimmable third resistor at the nominal process and temperature condition; and wherein a ratio between a resistance of the trimmable second resistor and the resistance of the trimmable third resistor is constant when said resistances are varied.

This first aspect of the present invention also extends to a method of configuring a signal processing device to compensate for process and temperature variations deviating from a nominal process and temperature condition, the signal processing device comprising:

i) a transconductance amplifier circuit portion having a respective voltage input and a current output, wherein the current output is dependent on the voltage input and a transconductance gain of said transconductance amplifier circuit portion;

ii) a transimpedance amplifier circuit portion having a respective current input and a voltage output, wherein the voltage output is dependent on the current input and a transimpedance gain of said transimpedance amplifier circuit portion, wherein said transconductance and transimpedance amplifier circuit portions are arranged in series;

iii) a bias circuit portion comprising first and second transistors configured such that:

a gate terminal and a drain terminal of the first transistor are connected to a gate terminal of the second transistor and to a reference current input configured to receive a reference current from a proportional-to-absolute-temperature current source;

a drain terminal of the second transistor is connected to a current supply input of the transconductance amplifier;

a source terminal of the first transistor is connected to a node via a first resistor; and a source terminal of the second transistor is connected to said node via a second resistor, wherein the second resistor is trimmable; and iv) a feedback circuit portion connected between the input and output of the transimpedance amplifier, said feedback circuit portion comprising a third resistor, wherein the third resistor is trimmable;

wherein a resistance of the first resistor is a predetermined value, said predetermined value being a resistance of the trimmable third resistor at the nominal process and temperature condition;

wherein the method comprises:

varying a respective resistance of each of the trimmable second and third resistors such that a ratio between the resistances of said trimmable second and third resistors is constant.

The first aspect of the present invention also extends to a non-transitory computer-readable medium comprising instructions that, when executed by a processor, cause the process to carry out a method of configuring a signal processing device to compensate for process and temperature variations deviating from a nominal process and temperature condition, the signal processing device comprising:

i) a transconductance amplifier circuit portion having a respective voltage input and a current output, wherein the current output is dependent on the voltage input and a transconductance gain of said transconductance amplifier circuit portion;

ii) a transimpedance amplifier circuit portion having a respective current input and a voltage output, wherein the voltage output is dependent on the current input and a transimpedance gain of said transimpedance amplifier circuit portion, wherein said transconductance and transimpedance amplifier circuit portions are arranged in series;

iii) a bias circuit portion comprising first and second transistors configured such that:

a gate terminal and a drain terminal of the first transistor are connected to a gate terminal of the second transistor and to a reference current input configured to receive a reference current from a proportional-to-absolute-temperature current source;

a drain terminal of the second transistor is connected to a current supply input of the transconductance amplifier;

a source terminal of the first transistor is connected to a node via a first resistor; and a source terminal of the second transistor is connected to said node via a second resistor, wherein the second resistor is trimmable; and iv) a feedback circuit portion connected between the input and output of the transimpedance amplifier, said feedback circuit portion comprising a third resistor, wherein the third resistor is trimmable;

wherein a resistance of the first resistor is a predetermined value, said predetermined value being a resistance of the trimmable third resistor at the nominal process and temperature condition;

wherein the method comprises:

varying a respective resistance of each of the trimmable second and third resistors such that a ratio between the resistances of said trimmable second and third resistors is constant.

The first aspect of the present invention also extends to a computer software product comprising instructions that, when executed by a processor, cause the process to carry out a method of configuring a signal processing device to compensate for process and temperature variations deviating from a nominal process and temperature condition, the signal processing device comprising:

i) a transconductance amplifier circuit portion having a respective voltage input and a current output, wherein the current output is dependent on the voltage input and a transconductance gain of said transconductance amplifier circuit portion;

ii) a transimpedance amplifier circuit portion having a respective current input and a voltage output, wherein the voltage output is dependent on the current input and a transimpedance gain of said transimpedance amplifier circuit portion, wherein said transconductance and transimpedance amplifier circuit portions are arranged in series;

iii) a bias circuit portion comprising first and second transistors configured such that:

a gate terminal and a drain terminal of the first transistor are connected to a gate terminal of the second transistor and to a reference current input configured to receive a reference current from a proportional-to-absolute-temperature current source;

a drain terminal of the second transistor is connected to a current supply input of the transconductance amplifier;

a source terminal of the first transistor is connected to a node via a first resistor; and a source terminal of the second transistor is connected to said node via a second resistor, wherein the second resistor is trimmable; and iv) a feedback circuit portion connected between the input and output of the transimpedance amplifier, said feedback circuit portion comprising a third resistor, wherein the third resistor is trimmable;

wherein a resistance of the first resistor is a predetermined value, said predetermined value being a resistance of the trimmable third resistor at the nominal process and temperature condition;

wherein the method comprises:

varying a respective resistance of each of the trimmable second and third resistors such that a ratio between the resistances of said trimmable second and third resistors is constant.

Thus it will be appreciated that embodiments of the present invention provide an improved arrangement which allows for the total gain (i.e. the product of the transconductance and transimpedance gains) to be substantially independent of process and temperature variations. The resistors added to the bias circuit portion (i.e. the first and second resistors) improve the current mirror arrangement compared to conventional arrangements known in the art per se because it allows for variable degeneration of the bias current supplied to the transconductance amplifier.

The first resistor is selected such that its resistance is substantially equal to a 'default' or 'typical' value $R_{typ}$ of the trimmable third (i.e. feedback) resistor for typical process and temperature. The second resistor is then trimmed proportionally to the trimming of the third resistor, such that as the third resistor is trimmed to control the bandwidth accounting for process variations, the second resistor is likewise trimmed such that the changes to the third resistor do not substantially alter the overall gain of the device.

With the arrangement of the present invention, the total gain (i.e. the product of the transconductance and transimpedance gains) can be kept substantially constant even as the feedback resistor (i.e. the third resistor) is trimmed for bandwidth purposes. The resistor dependency of the bias current supplied to the transconductance provides a mechanism by which the gain of the transconductance amplifier can be varied to compensate changes in the gain of the transimpedance amplifier, where varying the resistance of the third resistor (i.e. in the feedback circuit portion) necessitates varying of the second resistor (i.e. in the bias circuit portion) proportionally.

As outlined above, when the resistance of the third resistor is varied, the resistance of the second resistor is changed proportionally such that their ratio remains constant. In some embodiments, the second and third resistors have the same resistance, such that the ratio between them is unity (i.e. $R_3:R_2=1:1$). However, the resistances of the trimmable second and third resistors need not be the same. Having the second and third resistors have different resistances such that the ratio between them is greater or smaller than unity (i.e. $R_3:R_2 \neq 1:1$) may allow for the overall gain to be set to a value other than unity, where the overall gain of the device depends on this ratio.

The respective resistance of the trimmable second and third resistors is set to be an appropriate scale factor multiple of the resistance of the first resistor in the bias circuit portion. This scale factor may be expressed as 1+α. Thus when the resistance of the first resistor is set to a value $R_{typ}$ typical of the third resistor at the nominal temperature and process condition, the respective resistance of the second and third resistors may each be set to $(1+\alpha)*R_{typ}$.

By setting the resistance $R_1$ of the first resistor to $R_{typ}$, and by setting the respective resistances $R_2$ and $R_3$ of the second and third resistors to $R_{typ}(1+\alpha)$ and $N*R_{typ}(1+\alpha)$ respectively (where N is the ratio of $R_3:R_2$), the expression for the transconductance amplifier biasing current $I_{bias}$ can be rewritten as per Equation 4 below:

$$I_{bias} = I_{PTAT}\frac{R_1}{R_2} = I_{300}\frac{q}{k}\frac{1}{1+\alpha} \quad \text{Equation 4}$$

Bias current supplied to transconductance amplifier

Substituting this into the expression for the total gain yields Equation 5 below:

$$K_{tot} = K_{OTA}I_{300}\frac{q}{k}G(I)N\frac{1}{1+\alpha}R_{typ}(1+\alpha) = CONST(T)\times R_{typ} \quad \text{Equation 5}$$

Temperature and process invariant gain

It can be seen from Equation 5 that this results in the gain being independent of both temperature and process variation.

The first and second transistors form a current mirror arrangement, where the drain-source current—i.e. the current from the PTAT source—that flows through the first transistor is 'mirrored' as the drain-source current through the second transistor. In other words, the drain-source current through the second transistor is dependent on the drain-source current through the first transistor. While these may be equal (where the first and second transistors are identical and where the first and second resistors have equal resistance), these need not be the case, and the drain-source current through the second transistor—which is provided as the supply current to the transconductance amplifier circuit portion—may be a scaled version of the drain-source current through the first transistor.

As outlined above, the current mirror transfers a (potentially scaled) 'copy' of the current supplied by the PTAT current source to the transconductance amplifier circuit portion. This PTAT current source may be external of the electronic device, however in some embodiments the electronic device comprises the proportional-to-absolute-temperature current source.

The first and second transistors may comprise any suitable type of transistor, however in some embodiments they each comprise a field-effect-transistor (FET), and may comprise a metal-oxide-semiconductor FET or 'MOSFET'. In a particular set of embodiments, the first and second transistors each comprise an n-channel MOSFET, and may each comprise an n-channel enhancement type MOSFET. It will be appreciated, however, that p-channel devices and/or depletion-type devices could be used instead.

The gain of the transimpedance amplifier will, in general, be set by the resistance of the feedback resistor, i.e. the 'third' resistor of the feedback circuit portion. The third resistor may have a first terminal thereof connected to the input of the transimpedance amplifier, and a second terminal thereof connected to the output of the transimpedance amplifier.

In some embodiments, the feedback circuit portion further comprises a capacitor connected in parallel with the third resistor. This capacitor provides the transimpedance amplifier with resistive-capacitive (or 'RC') feedback. In some such embodiments, the capacitor may have a first terminal thereof connected to the first terminal of the third resistor, and a second terminal thereof connected to the second terminal of the third resistor. The capacitance of this feedback capacitor may, in general, influence the bandwidth of the amplifier and thus the electronic device as a whole.

In general, the device may be arranged to receive an input voltage and supply an output voltage. As such, the input voltage may be first supplied to the transconductance amplifier circuit portion, which then supplies the resulting current it generates to the transimpedance amplifier circuit portion. The transimpedance circuit portion may then generate a resultant output voltage. Thus, in some embodiments, the electronic device is configured such that:

the transconductance amplifier circuit portion comprises a respective input configured to receive an input voltage, and a respective output configured to generate a current dependent on said input voltage; and the transimpedance amplifier circuit portion comprises a respective input configured to receive the current from said transconductance amplifier, and a respective output configured to generate an output voltage dependent on said current.

In other embodiments, the device may be arranged to receive an input current and supply an output current, in which case the input current may be first supplied to the transimpedance amplifier circuit portion, which then supplies the resulting voltage it generates to the transimpedance amplifier circuit portion.

The transconductance amplifier circuit portion may, in some embodiments, comprise an inverting input and a non-inverting input. The input voltage supplied to the transconductance amplifier may be a differential input voltage, and this differential input voltage may be supplied across the inverting and non-inverting inputs of the transconductance amplifier circuit portion. The current generated by the transconductance amplifier circuit portion may be equal to the difference between the voltages at its non-inverting and inverting inputs, multiplied by the transconductance gain. The output of the transconductance amplifier circuit portion may be single-ended or differential.

The transconductance amplifier circuit portion may comprise an operational transconductance amplifier (OTA).

The transimpedance amplifier circuit portion may, in some embodiments, comprise an inverting input and a non-inverting input. The current supplied to the transconductance amplifier may be single-ended and supplied to the inverting input of the transimpedance amplifier circuit portion. The non-inverting input of the transimpedance amplifier circuit portion may, in some embodiments, be connected to a fixed level, which may be ground or virtual ground. In such embodiments, the first terminal of the third resistor may be connected to the inverting input of the transimpedance amplifier.

The transconductance amplifier circuit portion may comprise an operational amplifier.

The first aspect of the invention extends to a radio transceiver device, radio receiver device, and/or radio transmitter device comprising the signal processing device outlined hereinabove.

It will also be appreciated that the optional features described hereinabove in respect of any of the foregoing aspect(s) of the invention apply equally to the other aspect(s) of the invention.

BRIEF DESCRIPTION OF DRAWINGS

Certain embodiments of the invention will now be described, by way of non-limiting example only, with reference to the accompanying drawings in which.

DETAILED DESCRIPTION

Figure 1:
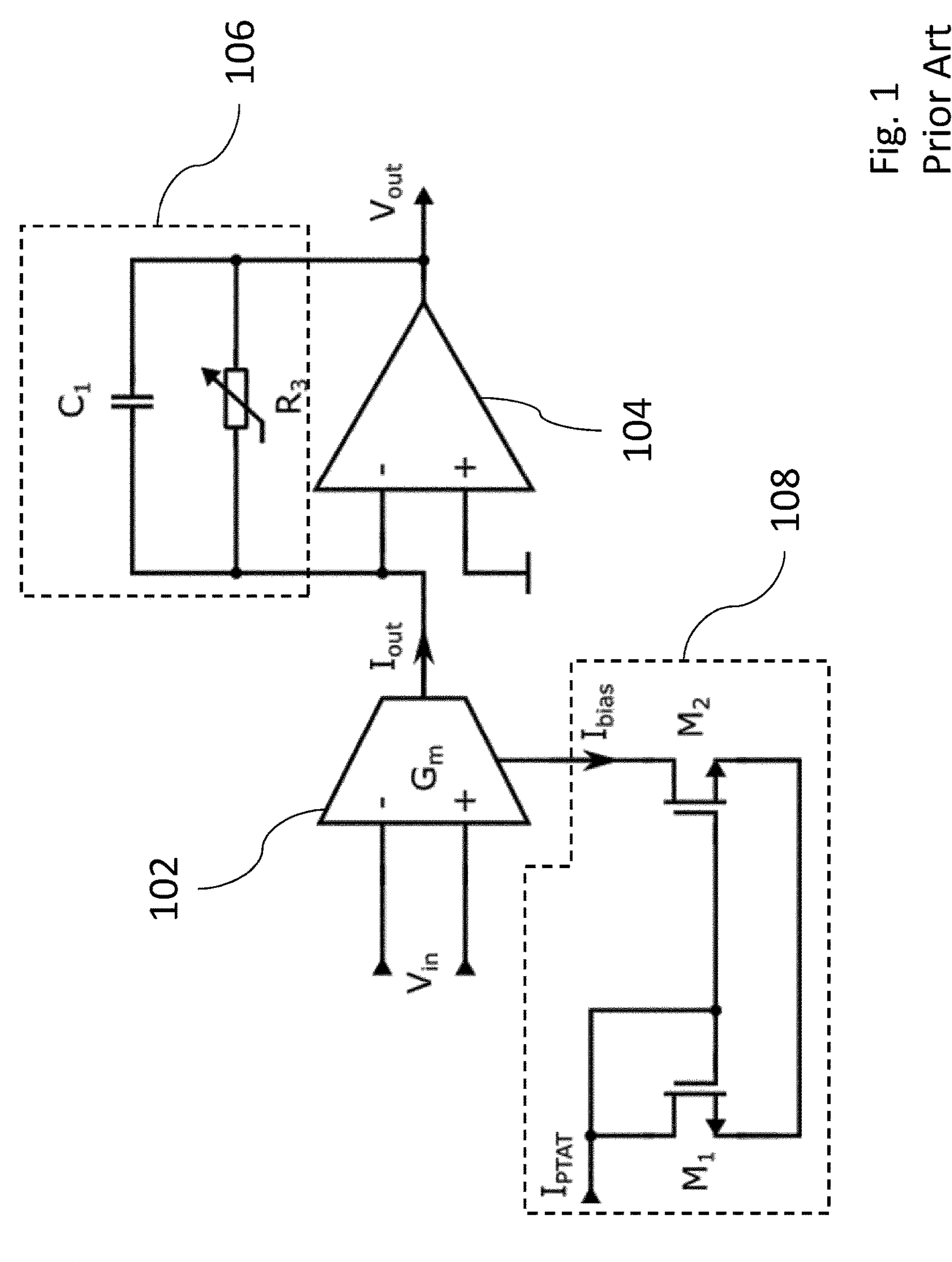
FIG. 1 is a schematic diagram of a prior art electronic device having cascaded transconductance and transimpedance amplifier stages.
Figure 2:
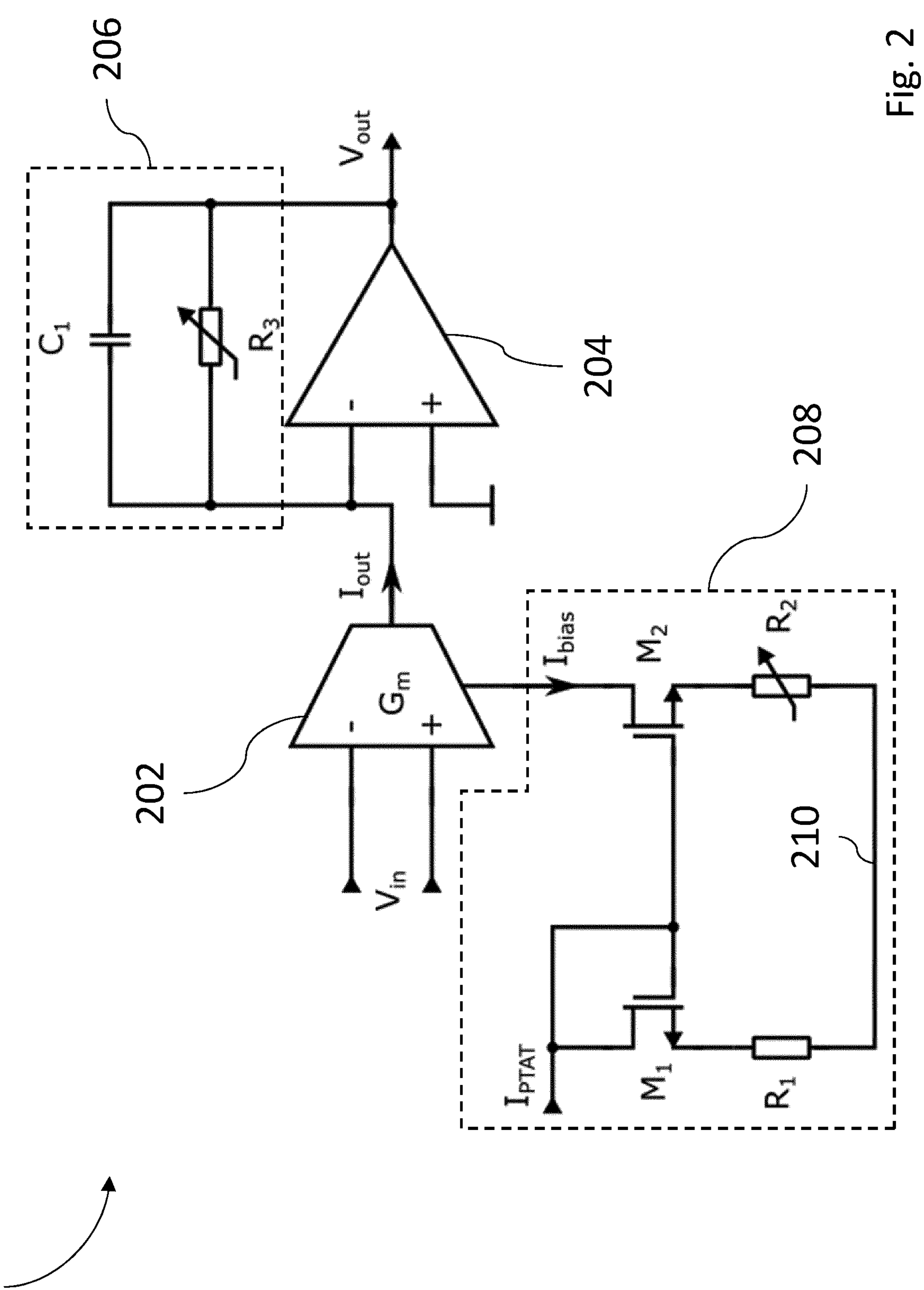
FIG. 2 is a schematic diagram of a electronic device having cascaded transconductance and transimpedance amplifier stages in accordance with an embodiment of the present invention.

FIG. 2 is a schematic diagram of a electronic device 200 having cascaded transconductance amplifier circuit portion 202 and transimpedance amplifier circuit portion 204 stages in accordance with an embodiment of the present invention. The transimpedance amplifier circuit portion 204 is provided with a feedback circuit portion 206. Elements having reference numerals starting with a '2' correspond in structure and function to those elements having corresponding reference numerals starting with a '1' described previously with reference to FIG. 1, unless context dictates otherwise.

To compensate the gain change (across process variations) introduced by trimming of the feedback resistor $R_3$ as outlined previously with respect to FIG. 1, the bias current $I_{bias}$ supplied to the transconductance amplifier circuit portion 202 by the bias circuit portion 208 is made resistance-dependent.

The bias circuit portion 208 comprises first and second transistors $M_1$, $M_2$ which are configured such that the gate and drain terminals of the first transistor $M_1$ are connected to the gate terminal of the second transistor $M_2$. These terminals (i.e. the gates of $M_1$ and $M_2$ and the drain of $M_1$) are connected (or are connectable) to a reference PTAT current source that supplies a reference current $I_{PTAT}$. The drain terminal of the second transistor $M_2$ is connected to the current supply input of the transconductance amplifier 202. The source terminal of the first transistor $M_1$ is connected to a node 210 via a first resistor $R_1$, and the source terminal of the second transistor $M_2$ is connected to that same node 210 via a second resistor $R_2$, where the second resistor $R_2$ is trimmable.

Thus rather than simply mirroring the PTAT current $I_{PTAT}$ (as in FIG. 1), the current mirror $M_1$, $M_2$ within the bias circuit portion 208 in FIG. 2 provides a variably degenerated version of the reference current $I_{PTAT}$, generated by the current mirror arrangement $M_1$, $M_2$, $R_1$ and $R_2$, as outlined below. Newly introduced degeneration resistors $R_1$ and $R_2$, added to the source terminals of $M_1$ and $M_2$ respectively, provide for this degenerated version of $I_{PTAT}$ to be supplied as $I_{bias}$ to the transconductance amplifier 202.

The first resistor $R_1$ is a fixed resistor having a resistance $R_{typ}$, which is a 'default' value corresponding to the typical value of the resistance of the trimmed feedback resistor $R_3$ with a typical process. Conversely, the second resistor $R_2$ is trimmable and may be set to the same resistance as the third resistor $R_3$, i.e. the resistor in the feedback circuit portion 208, or may be set to an appropriate scale factor multiple of the resistance of the third resistor $R_3$.

By setting the resistance $R_1$ of the first resistor to $R_{typ}$, and by setting the respective resistances $R_2$ and $R_3$ of the second and third resistors to $R_{typ}$ (1+α) and N*$R_{typ}$ (1+α) respectively, the expression for the transconductance amplifier biasing current $I_{bias}$ can be rewritten as per Equation 4, which is reproduced below:

$$I_{bias} = I_{PTAT}\frac{R_1}{R_2} = I_{300}\frac{q}{k}\frac{1}{1+\alpha} \qquad \text{Equation 4}$$

Bias current supplied to transconductance amplifier

As outlined previously, substituting this into the expression for the total gain yields Equation 5, reproduced below:

$$K_{tot} = K_{OTA}I_{300}\frac{q}{k}G(I)N\frac{1}{1+\alpha}R_{typ}(1+\alpha) = CONST(T)\times R_{typ} \qquad \text{Equation 5}$$

Temperature and process invariant gain

It can be seen from Equation 5 that this results in the gain being independent of both temperature and process variation.

If the respective resistances $R_2$ and $R_3$ of the second and third resistors are both set to $R_{typ}$ (1+α), i.e. such that their ratio N=1, this simplifies further to Equation 6 below:

$$K_{tot} = K_{OTA}I_{300}\frac{q}{k}G(I)\frac{1}{1+\alpha}R_{typ}(1+\alpha) = CONST(T)\times R_{typ} \qquad \text{Equation 6}$$

Temperature and process invariant gain where $R_2$ and $R_3$ are equal

It will be appreciated that as the ratio value N is constant (whether it is unity or not), it does not change the end result that the total gain $K_{tot}$ is constant with respect to temperature. The particular N chosen is a scaling factor, and does not alter the functionality of the device.

Figure 3:
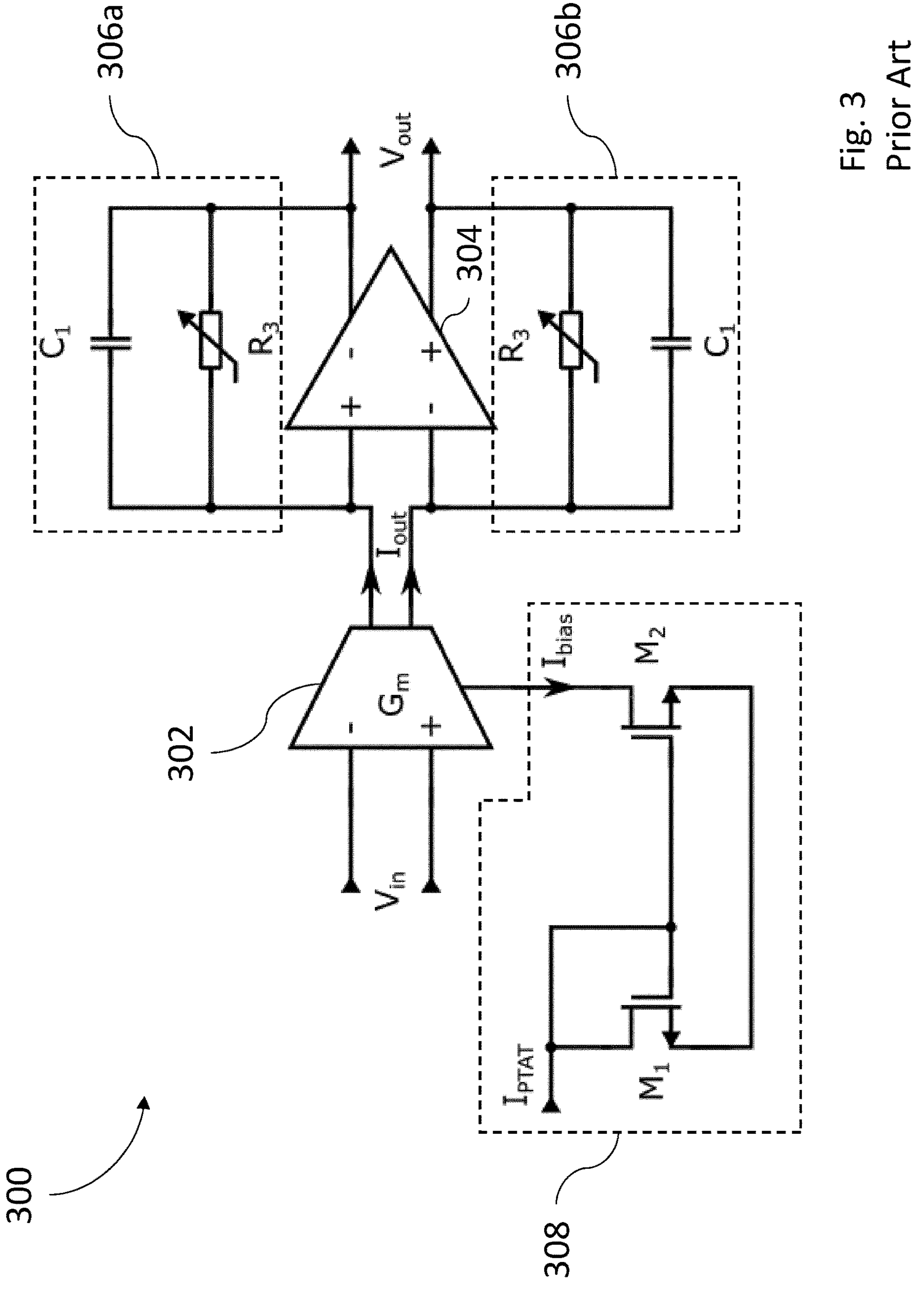
FIG. 3 is a schematic diagram of a prior art electronic device having differential cascaded transconductance and transimpedance amplifier stages.

FIG. 3 is a schematic diagram of a prior art electronic device 300 having differential cascaded transconductance and transimpedance amplifier stages. Elements having reference numerals starting with a '3' correspond in structure and function to those elements having corresponding reference numerals starting with a '1' described previously with reference to FIG. 1, unless context dictates otherwise.

It will be appreciated that, when compared to the device 100 of FIG. 1, the differential device 300 of FIG. 3 makes use of both the inverting and non-inverting inputs of the transimpedance amplifier circuit portion 304, where the output current $I_{out}$ from the transconductance amplifier circuit portion 302 is differential (depending on the input voltage $V_{in}$ across its input terminals), and where the output voltage $V_{out}$ of the transimpedance amplifier circuit portion 304 is also differential.

The transimpedance amplifier circuit portion 304 is provided with two identical feedback circuits 306*a*, 306*b* each respectively constructed from a trimmable resistor $R_3$ and a capacitor $C_1$ connected in parallel between an input and output of the transimpedance amplifier 304. The first feedback circuit 306*a* is connected between the inverting output and non-inverting input of the transimpedance amplifier 304. The second feedback circuit 306*b* is connected between the non-inverting output and inverting input of the transimpedance amplifier 304.

Figure 4:
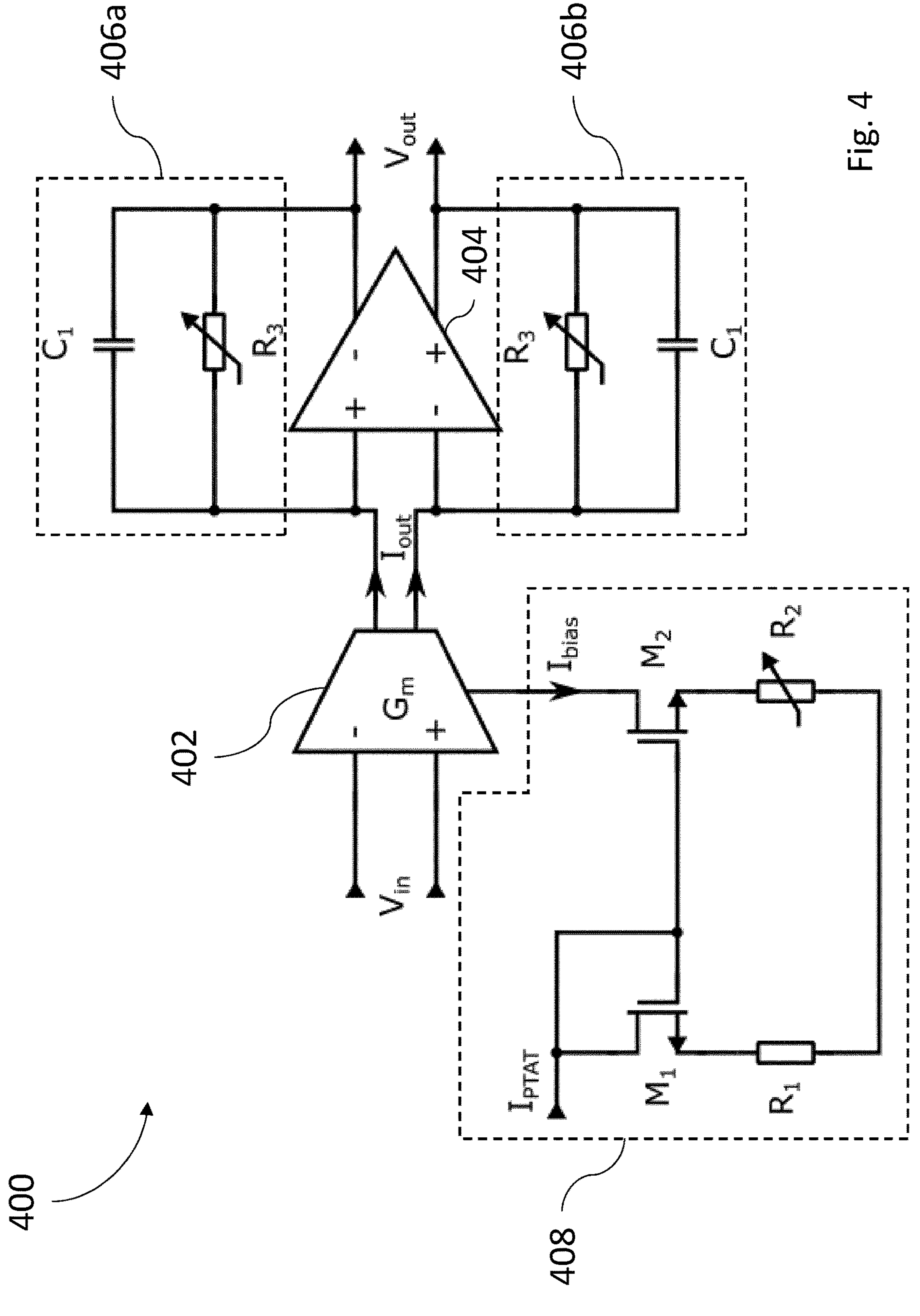
FIG. 4 is a schematic diagram of a electronic device having differential cascaded transconductance and transimpedance amplifier stages in accordance with a further embodiment of the present invention.

FIG. 4 is a schematic diagram of a electronic device 400 having differential cascaded transconductance and transimpedance amplifier stages in accordance with a further embodiment of the present invention. Elements having reference numerals starting with a '4' correspond in structure and function to those elements having corresponding reference numerals starting with a '2' described previously with reference to FIG. 2, and to those elements having corresponding reference numerals starting with a '3' described previously with reference to FIG. 3, unless context dictates otherwise.

Unlike the prior art device 300 of FIG. 3, however, the device 400 uses the same resistance-dependent bias circuit portion 408 arrangement as the device 200 of FIG. 2 as outlined above, in accordance with the present invention.

Thus it will be appreciated that embodiments of the present invention provide an improved arrangement in which the total gain of the device (i.e. the product of the respective gains of the transconductance and transimpedance amplifier stages) is constant across temperature and process variations. This may be particularly advantageous in, for example, analogue signal processing chains such as those found in radio receiver devices, where having constant gain and bandwidth across such variations in temperature and process is advantageous, e.g. to avoid the need for post-processing steps to rectify issues caused by such variations. In other words, the effects of process and temperature variation can be 'cancelled out' by the present invention.

While specific embodiments of the present invention have been described in detail, it will be appreciated by those skilled in the art that the embodiments described in detail are not limiting on the scope of the claimed invention.

The invention claimed is:

1. A signal processing device configured to compensate for process and temperature variations deviating from a nominal process and temperature condition, the signal processing device comprising:

i) a transconductance amplifier circuit portion having a respective voltage input and a current output, wherein the current output is dependent on the voltage input and a transconductance gain of said transconductance amplifier circuit portion;

ii) a transimpedance amplifier circuit portion having a respective current input and a voltage output, wherein the voltage output is dependent on the current input and a transimpedance gain of said transimpedance amplifier circuit portion, wherein said transconductance and transimpedance amplifier circuit portions are arranged in series;

iii) a bias circuit portion comprising first and second transistors configured such that:

a gate terminal and a drain terminal of the first transistor are connected to a gate terminal of the second transistor and to a reference current input configured to receive a reference current from a proportional-to-absolute-temperature current source;

a drain terminal of the second transistor is connected to a current supply input of the transconductance amplifier;

a source terminal of the first transistor is connected to a node via a first resistor; and a source terminal of the second transistor is connected to said node via a second resistor, wherein the second resistor is trimmable; and iv) a feedback circuit portion connected between the input and output of the transimpedance amplifier, said feedback circuit portion comprising a third resistor, wherein the third resistor is trimmable;

wherein a resistance of the first resistor is a predetermined value, said predetermined value being a resistance of the trimmable third resistor at the nominal process and temperature condition.

2. The signal processing device as claimed in claim 1, wherein a ratio between a resistance of the trimmable second resistor and the resistance of the trimmable third resistor is constant when said resistances are varied.

3. The signal processing device as claimed in claim 1, wherein a resistance of the second resistor is substantially equal to the resistance of the third resistor.

4. The signal processing device as claimed in claim 3, wherein the resistance of the first resistor is set to a value $R_{typ}$ typical of the third resistor at the nominal temperature and process condition, and each of the respective resistances of the second and third resistors are set to $(1+\alpha)*R_{typ}$.

5. The signal processing device as claimed in claim 1, wherein a resistance of the second resistor is different from the resistance of the third resistor.

6. The signal processing device as claimed in claim 5, wherein the resistance of the first resistor is set to a value $R_{typ}$ typical of the third resistor at the nominal temperature and process condition, the resistance of the second resistor is set to $(1+\alpha)*R_{typ}$, and the resistance of the third resistor is set to $N*(1+\alpha)*R_{typ}$.

7. The signal processing device as claimed in claim 1, further comprising the proportional-to-absolute-temperature current source.

8. The signal processing device as claimed in claim 1, wherein the third resistor has a first terminal thereof connected to the input of the transimpedance amplifier, and a second terminal thereof connected to the output of the transimpedance amplifier.

9. The signal processing device as claimed in claim 1, wherein the feedback circuit portion further comprises a capacitor connected in parallel with the third resistor.

10. The signal processing device as claimed in claim 9, wherein the capacitor has a first terminal thereof connected to a first terminal of the third resistor, and a second terminal thereof connected to a second terminal of the third resistor.

11. The signal processing device as claimed in claim 1, configured such that:

the transconductance amplifier circuit portion comprises a respective input configured to receive an input voltage, and a respective output configured to generate a current dependent on said input voltage; and the transimpedance amplifier circuit portion comprises a respective input configured to receive the current from said transconductance amplifier, and a respective output configured to generate an output voltage dependent on said current.

12. The signal processing device as claimed in claim 1, wherein the transconductance amplifier circuit portion comprises an inverting input and a non-inverting input, wherein the transconductance amplifier circuit portion is configured to receive a differential input voltage across the inverting and non-inverting inputs of the transconductance amplifier circuit portion.

13. The signal processing device as claimed in claim 1, wherein an output of the transconductance amplifier circuit portion is single-ended.

14. The signal processing device as claimed in claim 1, wherein an output of the transconductance amplifier circuit portion is differential.

15. The signal processing device as claimed in claim 1, wherein the transimpedance amplifier circuit portion comprises an inverting input and a non-inverting input.

16. The signal processing device as claimed in claim 15, wherein a current from the transconductance amplifier circuit portion is supplied to the inverting input of the transimpedance amplifier circuit portion.

17. The signal processing device as claimed in claim 15, wherein the non-inverting input of the transimpedance amplifier circuit portion is connected to a fixed level.

18. The signal processing device as claimed in claim 16, wherein the fixed level is ground or virtual ground.

19. A method of configuring a signal processing device to compensate for process and temperature variations deviating from a nominal process and temperature condition, the signal processing device comprising:

i) a transconductance amplifier circuit portion having a respective voltage input and a current output, wherein the current output is dependent on the voltage input and a transconductance gain of said transconductance amplifier circuit portion;

ii) a transimpedance amplifier circuit portion having a respective current input and a voltage output, wherein the voltage output is dependent on the current input and a transimpedance gain of said transimpedance amplifier circuit portion, wherein said transconductance and transimpedance amplifier circuit portions are arranged in series;

iii) a bias circuit portion comprising first and second transistors configured such that:

a gate terminal and a drain terminal of the first transistor are connected to a gate terminal of the second transistor and to a reference current input configured to receive a reference current from a proportional-to-absolute-temperature current source;

a drain terminal of the second transistor is connected to a current supply input of the transconductance amplifier;

a source terminal of the first transistor is connected to a node via a first resistor; and a source terminal of the second transistor is connected to said node via a second resistor, wherein the second resistor is trimmable; and iv) a feedback circuit portion connected between the input and output of the transimpedance amplifier, said feedback circuit portion comprising a third resistor, wherein the third resistor is trimmable;

wherein a resistance of the first resistor is a predetermined value, said predetermined value being a resistance of the trimmable third resistor at the nominal process and temperature condition;

wherein the method comprises:

varying a respective resistance of each of the trimmable second and third resistors such that a ratio between the resistances of said trimmable second and third resistors is constant.

20. A non-transitory computer-readable medium comprising instructions that, when executed by a processor, cause the processor to carry out the method of claim 19.

* * * * *